United States Patent
Tian et al.

(10) Patent No.: US 11,335,883 B2
(45) Date of Patent: May 17, 2022

(54) ORGANIC LIGHT-EMITTING DIODE DISPLAY SUBSTRATE WITH A PROTECTION LAYER AND MANUFACTURING METHOD THEREOF, AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Chunyan Xie, Beijing (CN); Chunyang Wang, Beijing (CN); Dong Li, Beijing (CN); Zheng Liu, Beijing (CN); Ming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 44 days.

(21) Appl. No.: 16/770,916

(22) PCT Filed: Dec. 4, 2019

(86) PCT No.: PCT/CN2019/122855
§ 371 (c)(1),
(2) Date: Jun. 8, 2020

(87) PCT Pub. No.: WO2020/114412
PCT Pub. Date: Jun. 11, 2020

(65) Prior Publication Data
US 2021/0226164 A1 Jul. 22, 2021

(30) Foreign Application Priority Data
Dec. 4, 2018 (CN) .......................... 201811473015.4

(51) Int. Cl.
*H01L 29/08* (2006.01)
*H01L 51/52* (2006.01)
*H01L 51/56* (2006.01)

(52) U.S. Cl.
CPC ...... *H01L 51/5253* (2013.01); *H01L 51/5221* (2013.01); *H01L 51/56* (2013.01)

(58) Field of Classification Search
CPC .................. H01L 51/5253; H01L 51/5221
See application file for complete search history.

(56) References Cited

U.S. PATENT DOCUMENTS 7,202,597 B2 * 4/2007 Sakurai ............... H01L 27/3253
313/500
10,535,724 B2 * 1/2020 Lee ..................... H01L 51/0097
(Continued)

FOREIGN PATENT DOCUMENTS

CN 103811532 A 5/2014
CN 107340942 A 11/2017
(Continued)

OTHER PUBLICATIONS

First Office Action dated Dec. 16, 2019 for application No. CN201811473015.4 with English translation attached.
(Continued)

*Primary Examiner* — Caleb E Henry
(74) *Attorney, Agent, or Firm* — Nath, Goldberg & Meyer; Joshua B. Goldberg

(57) ABSTRACT

The present disclosure provides an organic light-emitting diode display substrate and a manufacturing method thereof. The manufacturing method includes: sequentially forming a first electrode, a light-emitting layer and a second electrode on a base substrate; forming a protection layer having a first opening on a side of the second electrode distal to the base substrate; and forming a second opening in the second
(Continued)

electrode, the second opening being located below the first opening. In the present disclosure, with the protection layer, only a portion of the second electrode below the first opening is removed, so that other portions of the second electrode are prevented from being damaged, thereby eliminating a poor display of the display device.

20 Claims, 8 Drawing Sheets

(56) References Cited

U.S. PATENT DOCUMENTS

| | | | | |
|---|---|---|---|---|
| 2005/0236956 | A1* | 10/2005 | Chung | H01L 27/3246 |
| | | | | 313/463 |
| 2005/0247936 | A1* | 11/2005 | Bae | H01L 27/3253 |
| | | | | 257/59 |
| 2016/0049608 | A1* | 2/2016 | Hack | H01L 51/504 |
| | | | | 257/40 |
| 2018/0061870 | A1* | 3/2018 | Yang | H01L 29/66969 |

FOREIGN PATENT DOCUMENTS

| | | |
|---|---|---|
| CN | 107968157 A | 4/2018 |
| CN | 108091777 A | 5/2018 |
| CN | 108206244 A | 6/2018 |
| CN | 109616587 A | 4/2019 |
| JP | 2009231090 A | 10/2009 |

OTHER PUBLICATIONS

Second Office Action dated Jun. 1, 2020 for application No. CN201811473015.4 with English translation attached.
Third Office Action dated Sep. 30, 2020 for application No. CN201811473015.4 with English translation attached.

* cited by examiner

ORGANIC LIGHT-EMITTING DIODE DISPLAY SUBSTRATE WITH A PROTECTION LAYER AND MANUFACTURING METHOD THEREOF, AND DISPLAY DEVICE

CROSS REFERENCE TO RELATED APPLICATIONS

This is a National Phase Application filed under 35 U.S.C. 371 as a national stage of PCT/CN2019/122855, filed Dec. 4, 2019, an application claiming the benefit of Chinese Application No. 201811473015.4, filed Dec. 4, 2018, the content of each of which is hereby incorporated by reference in its entirety.

TECHNICAL FIELD

The present disclosure relates to the field of display technology, and in particular to an organic light-emitting diode display substrate and a manufacturing method thereof, and a display device.

BACKGROUND

In Organic Light-Emitting Diode (OLED) display devices, flexible display devices are taking on an increasingly important position. Meanwhile, an OLED full-screen has advantages such as a high screen-to-body ratio, a high resolution and the like, such that a visual experience of many users of games and videos is greatly improved. In addition, due to characteristics such as self-luminescence, a wide visual angle, almost infinite contrast and the like of the OLED technology, a better hardware is provided for applications of technologies such as fingerprint identification, face identification and VR/AR of smart phones.

SUMMARY

The present disclosure provides an organic light-emitting diode display substrate, a manufacturing method thereof, and a display device.

The method for manufacturing an organic light-emitting diode display substrate includes steps of: sequentially forming a first electrode, a light-emitting layer and a second electrode on a base substrate; forming a protection layer having a first opening on a side of the second electrode distal to the base substrate; and forming a second opening in the second electrode, the second opening being located below the first opening.

In an embodiment, the second electrode is a cathode.

In an embodiment, the steps of forming a protection layer having a first opening on a side of the second electrode distal to the base substrate; and forming a second opening in the second electrode, the second opening being located below the first opening include steps of: forming a protection material layer on a side of the second electrode distal to the base substrate; and by attaching a first metal mask to the protection material layer, forming the first opening in the protection material layer to form the protection layer having the first opening; and forming the second opening in the second electrode.

In an embodiment, the step of by attaching a first metal mask to the protection material layer, forming the first opening in the protection material layer to form the protection layer having the first opening; and forming the second opening in the second electrode includes steps of: forming the first opening in the protection material layer and forming the second opening in the second electrode by causing a first region of the protection material layer corresponding to the first opening to be formed and a second region of the second electrode corresponding to the first region to be subjected to a plasma treatment or a chemical etching treatment through a second metal mask.

In an embodiment, the steps of forming a protection layer having a first opening on a side of the second electrode distal to the base substrate; and forming a second opening in the second electrode, the second opening being located below the first opening include steps of: forming the protection layer having the first opening on a side of the second electrode distal to the base substrate by attaching a third metal mask to the second electrode; and removing a portion of the second electrode below the first opening to form the second opening in the second electrode.

In an embodiment, the forming the protection layer having the first opening on a side of the second electrode distal to the base substrate by attaching a third metal mask to the second electrode includes steps of: forming the protection layer having the first opening on a side of the second electrode distal to the base substrate through a third metal mask and by using a chemical vapor deposition process, such that a blocking structure for forming the first opening is formed on the third metal mask.

In an embodiment, the step of removing a portion of the second electrode below the first opening to form the second opening in the second electrode includes steps of forming the second opening in the second electrode by causing the portion of the second electrode below the first opening to be subjected to a plasma bombardment or a chemical etching treatment through a second metal mask to remove the portion of the second electrode below the first opening, and a third opening for forming the second opening is formed on the second metal mask.

In an embodiment, the step of removing a portion of the second electrode below the first opening to form the second opening in the second electrode includes steps of forming the second opening in the second electrode by using the protection layer having the first opening as a mask to cause the portion of the second electrode below the first opening to be subjected to a plasma bombardment or a chemical etching treatment to remove the portion of the second electrode below the first opening.

In an embodiment, a material of the protection layer is an inorganic material.

In an embodiment, the protection layer has a thickness in a range of about 10 nm to about 600 nm.

In an embodiment, the method for manufacturing an organic light-emitting diode display substrate further includes steps of: forming a first encapsulation layer on a side of the protection layer distal to the base substrate, such that the first encapsulation layer fills in the first opening and the second opening.

In an embodiment, a material of the first encapsulation layer is an inorganic material.

In an embodiment, the first encapsulation layer has a thickness in a range of 50 nm to 800 nm.

The present disclosure provides an organic light-emitting diode display substrate, including: a base substrate; a first electrode, a light-emitting layer and a second electrode having a second opening sequentially provided on the base substrate; and a protection layer having a first opening on a side of the second electrode distal to the base substrate, and the second opening is below the first opening, and orthographic projections of the first opening and the second opening on the base substrate are substantially overlapped with each other.

In an embodiment, the organic light-emitting diode display substrate further includes a first encapsulation layer on a side of the protection layer distal to the base substrate, the first encapsulation layer filling in the first and second openings.

An embodiment of the present disclosure provides a display device, including the above organic light-emitting diode display substrate and a camera, the camera is on a side of the base substrate distal to the second electrode, and an orthographic projection of the camera on the base substrate is within the orthographic projection of the second opening on the base substrate, or the orthographic projection of the camera on the base substrate is substantially overlapped with the orthographic projection of the second opening on the base substrate.

DETAIL DESCRIPTION OF EMBODIMENTS

An organic light-emitting diode display substrate and a manufacturing method thereof provided in the present disclosure will be described in detail below with reference to the accompanying drawings, such that those skilled in the art may understand the technical solution of the present disclosure better.

A cathode film layer of an OLED device corresponding to a camera of an OLED full-screen needs to be removed, so that a penetration rate of light is not influenced. In the prior art, a corresponding portion of the cathode film layer is processed by using a mask for protection and a plasma etching treatment directly after a Thin Film Encapsulation (TFE) process. Since an exposure interval of the mask is limited and is influenced by plasma diffusion, a portion of the cathode film layer which does not need to be etched, except a portion of the cathode film layer corresponding to a camera region, is also easily damaged, thereby causing a poor display of an entire display device.

Figure 1:
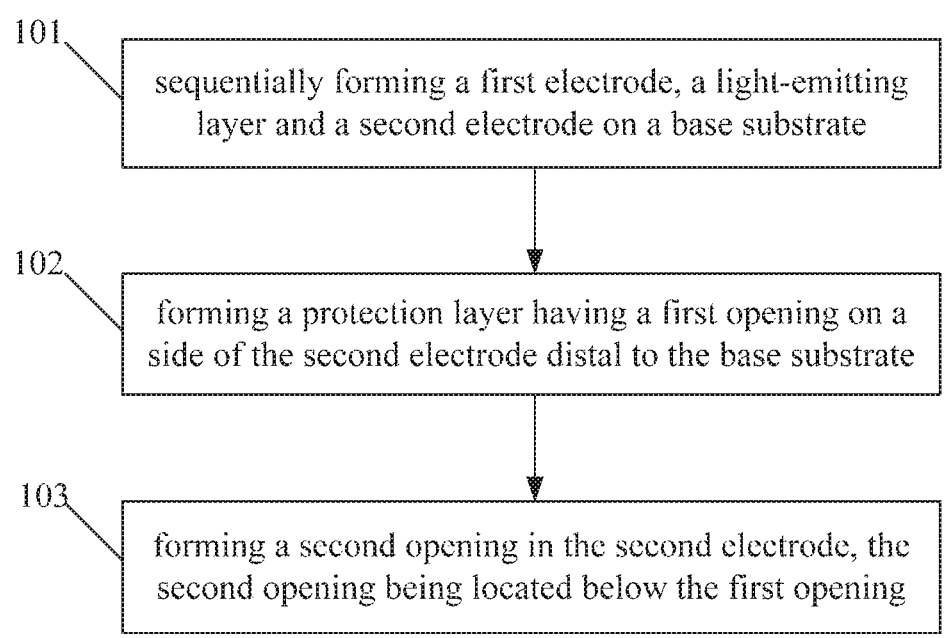
FIG. 1 is a flowchart of a method for manufacturing a display substrate according to an embodiment of the present disclosure.

FIG. 1 is a flowchart of a method for manufacturing an organic light-emitting diode display substrate according to an embodiment of the present disclosure, and as shown in FIG. 1, the method includes:

Step 101, sequentially forming a first electrode, a light-emitting layer and a second electrode on a base substrate.

Step 102, forming a protection layer having a first opening on a side of the second electrode distal to the base substrate.

Step 103, forming a second opening in the second electrode, wherein the second opening is located below the first opening.

In the technical solution of the method for manufacturing an organic light-emitting diode display substrate provided in this embodiment, the protection layer having a first opening is formed on a side of the second electrode distal to the base substrate, and a second opening is formed in the second electrode, wherein the second opening is located below the first opening. That is, in this embodiment, only a portion of the second electrode below the first opening is removed under a protection of the protection layer, so that the portion of the second electrode except the second opening is prevented from being damaged. In addition, when the first opening corresponds to a camera region, the portion of the second electrode at the periphery of the camera region is prevented from being damaged, and therefore a poor display of a display device is avoided. As shown in the figures, the first opening and the second opening in the present disclosure are both through holes, i.e., the first opening 7 is a through hole formed in the protection material layer, and the second opening is a through hole formed in the second electrode.

Figure 2A:
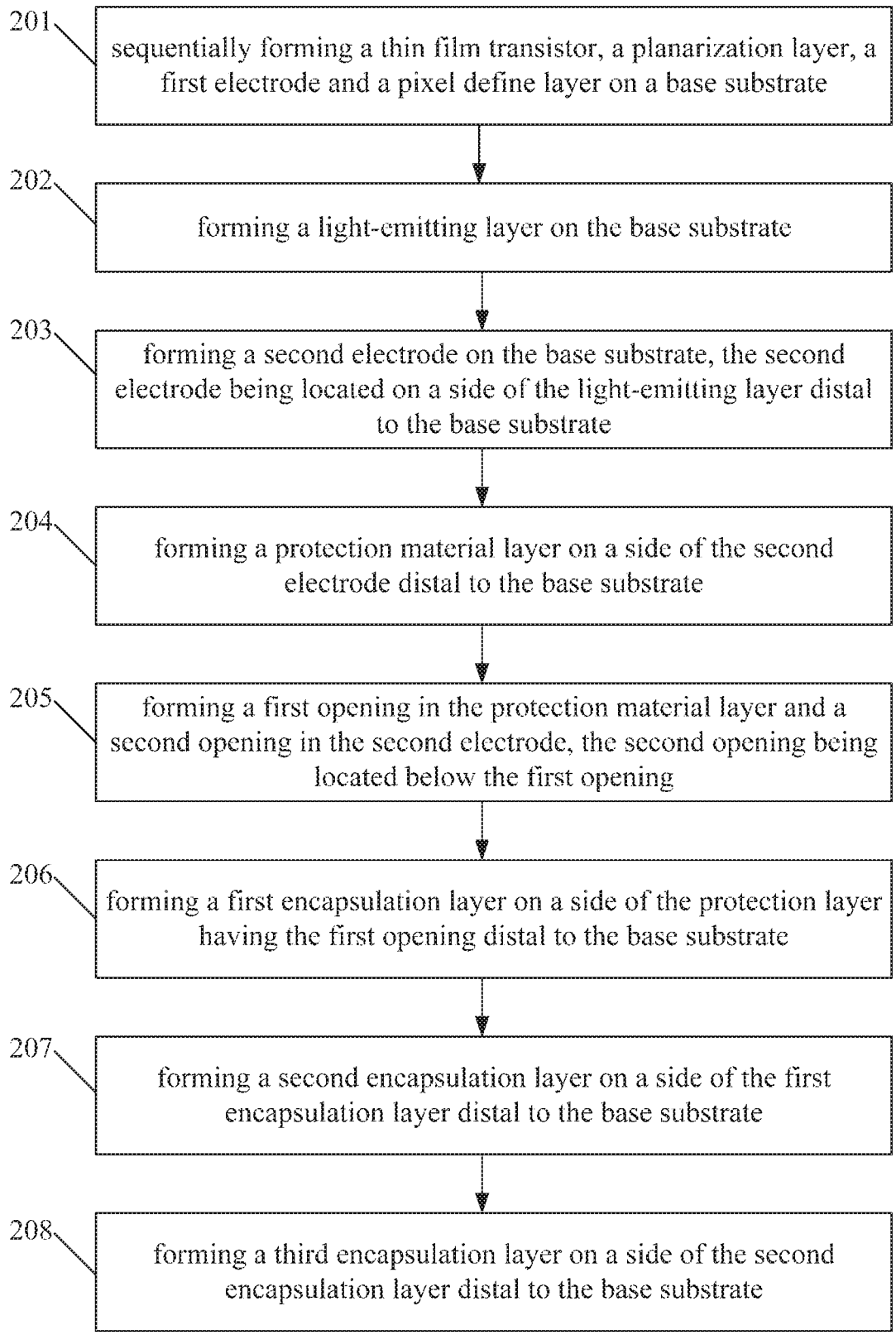
FIG. 2a is a flowchart of a method for manufacturing a display substrate according to an embodiment of the present disclosure.
Figure 2B:
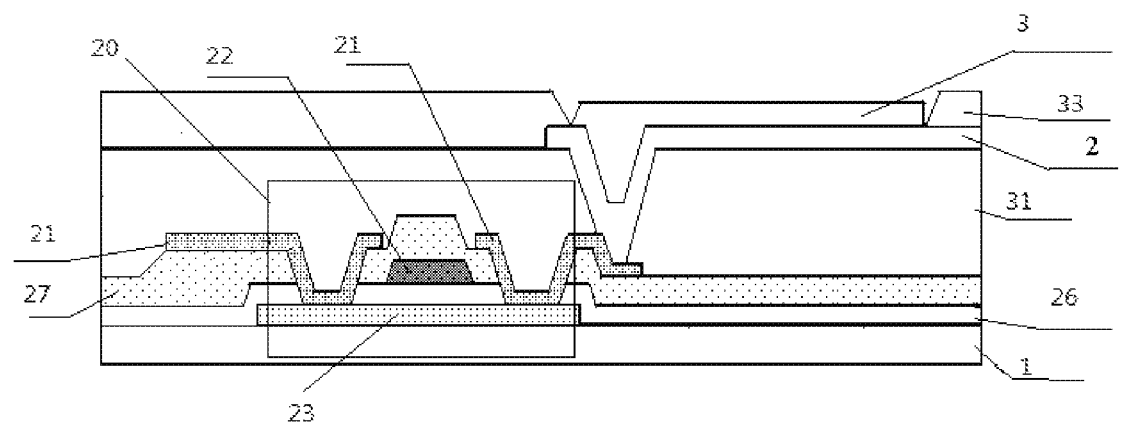
FIG. 2b is a schematic view of a structure of a display substrate according to an embodiment of the present disclosure.

FIG. 2a is a flowchart of a method for manufacturing an organic light-emitting diode display substrate according to an embodiment of the present disclosure, and as shown in FIG. 2a and FIG. 2b, the method includes:

Step 201, sequentially forming a thin film transistor, a planarization layer, a first electrode and a pixel define layer on a base substrate.

Figure 3A:
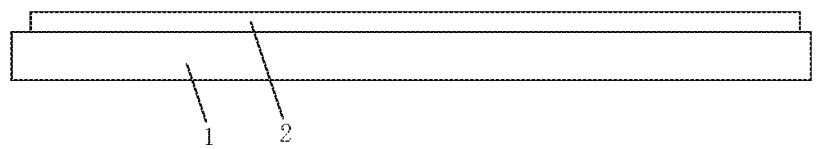
FIG. 3a is a schematic view illustrating forming a first electrode.

FIG. 3a is a schematic view illustrating forming a first electrode. As shown in FIG. 3a and FIG. 2b, a thin film transistor 20, a planarization layer 31, a first electrode 2, and a pixel define layer (PDL) 33 are sequentially formed on a base substrate 1. The thin film transistor 20 may include an active layer 23, a gate electrode 22, and source and drain electrodes 21 formed above the base substrate 1, the active layer 23 is located on the base substrate 1, the gate electrode 22 is located on a side of the active layer 23 distal to the base substrate 1, the source and drain electrodes 21 are located at both sides of the gate electrode 22, and the source and drain electrodes 21 are electrically connected to the active layer 23. An insulating layer 26 is formed on a side of the active layer 23 distal to the base substrate 1, the gate electrode 22 is located on a side of the insulating layer 26 distal to the base substrate 1, an interlayer dielectric (ILD) layer 27 is formed on a side of the gate electrode 22 distal to the base substrate 1, and the source and drain electrodes 21 are located on a side of the interlayer dielectric layer distal to the base substrate 1. The planarization layer 31 is located on a side of the source and drain electrodes 21 distal to the base substrate 1, the first electrode 2 is located on a side of the planarization layer 31 distal to the base substrate 1, and the pixel define layer 33 is located on a side of the first electrode 2 distal to the base substrate 1. The display substrate may further include a photo spacer (PS) located on a side of the pixel define layer 33 distal to the base substrate 1. Optionally, the first electrode 2 is an anode. Optionally, a material of the active layer 23 may be P—Si. A material of the first electrode 2 is typically a transparent material such as ITO or Ag. A material of the second electrode 4 is typically a Mg and Ag alloy, which may include MgF.

In this embodiment, the thin film transistor is a single gate thin film transistor. However, the thin film transistor of the present embodiment is not limited thereto, and other types of thin film transistors, such as a dual gate thin film transistor, may be used in practical applications.

It should be noted that only the base substrate 1 and the first electrode 2, the light-emitting layer 3 formed on the first electrode 2, and the second electrode 4 formed on the light-emitting layer 3 are shown in the following description, and a structure of the thin film transistor is not specifically shown in the following drawings.

Step 202, forming a light-emitting layer on the base substrate.

Figure 3B:
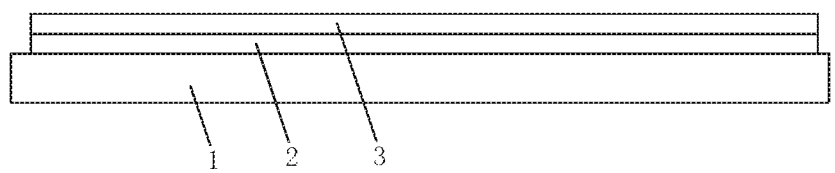
FIG. 3b is a schematic view illustrating forming a light-emitting layer.

FIG. 3b is a schematic view illustrating forming a light-emitting layer. As shown in FIG. 3b, specifically, the light-emitting layer 3 is evaporated on the base substrate 1. Optionally, the light-emitting layer 3 may include a hole injection layer, a hole transport layer, an emission layer, an electron transport layer, and an electron injection layer, which are sequentially formed, the hole injection layer is adjacent to the first electrode 2. The light-emitting layer 3 is located in a region defined by the pixel define layer 33.

Step 203, forming a second electrode on the base substrate, wherein the second electrode is located on a side of the light-emitting layer distal to the base substrate.

Figure 3C:
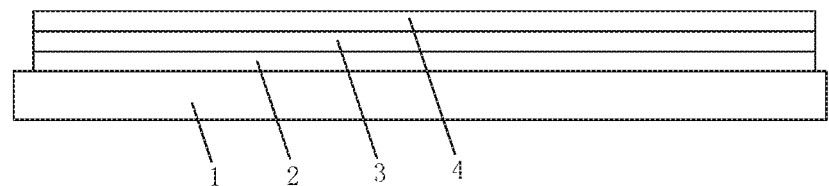
FIG. 3c is a schematic view illustrating forming a second electrode.

FIG. 3c is a schematic view illustrating forming a second electrode. As shown in FIG. 3c, a second electrode 4 is formed on a side of the light-emitting layer 3 distal to the base substrate 1. Optionally, the second electrode 4 is a cathode.

Step 204, forming a protection material layer on a side of the second electrode distal to the base substrate.

Figure 3D:
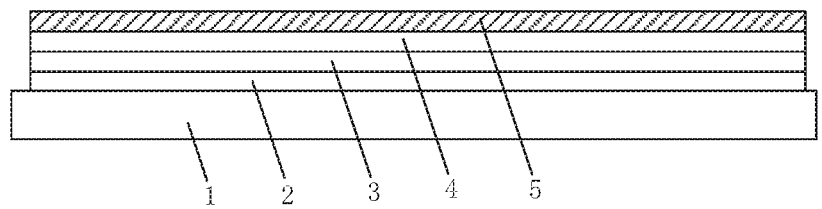
FIG. 3d is a schematic view illustrating forming a protection material layer.

FIG. 3d is a schematic view illustrating forming a protection material layer. As shown in FIG. 3d, a protection material layer 5 is formed on a side of the second electrode 4 distal to the base substrate 1. Specifically, the protection material layer 5 is formed on the side of the second electrode 4 distal to the base substrate 1 through a first metal mask and by using a Chemical Vapor Deposition (CVD) process. Optionally, a material of the protection material layer 5 is an inorganic material, and a thickness of the protection material layer 5 is in a range of 10 nm to 600 nm. Optionally, the first metal mask is a Chemical Vapor Deposition mask (CVD mask). When performing a coating process of an inorganic material, the Chemical Vapor Deposition mask is used to shield the base substrate 1, so as to coat the inorganic material on an effective region (shown in FIG. 3d) above the base substrate 1. In the present embodiment, the protection material layer 5 is formed by a Chemical Vapor Deposition process, instead of using an exposing-etching process.

In this embodiment, a thickness of the second electrode 4 may be in a range of 1 nm to 25 nm. The second electrode (cathode) 4 is thin, and therefore does not come into direct contact with the first metal mask as much as possible during the process, so as to avoid contamination or breakage.

Step 205, forming a first opening in the protection material layer and a second opening in the second electrode, the second opening is located below the first opening.

Figure 3E:
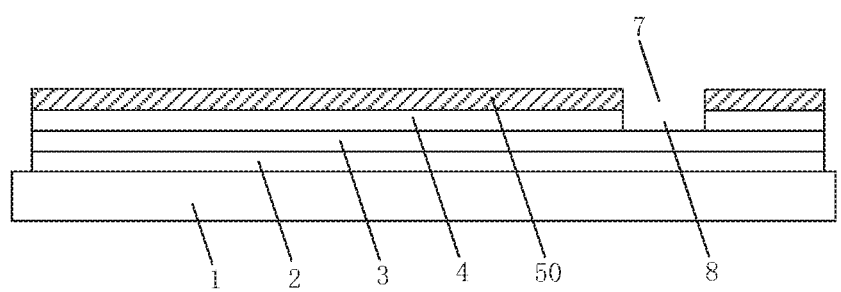
FIG. 3e is a schematic view illustrating forming a first opening and a second opening.
Figure 3F:
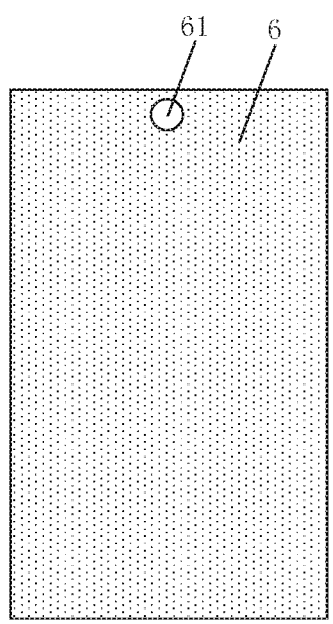
FIG. 3f is a schematic view illustrating a second metal mask.

FIG. 3e is a schematic view illustrating forming the first opening and the second opening, and FIG. 3f is a schematic view illustrating a second metal mask. As shown in FIG. 3e and FIG. 3f, a first region of the protection material layer 5 and a second region of the second electrode 4 corresponding to the first region are subjected to a plasma treatment through a second metal mask 6, a first opening 7 is formed in the protection material layer 5, and a second opening 8 is formed in the second electrode 4, the first opening 7 and the second opening 8 are formed by attaching the second metal mask to the protection material layer 5 (for example, placing the second metal mask on the protection material layer 5). The first region corresponds to the first opening 7, and the first opening 7 is formed after removing a part of the first region of the protection material layer; the second region corresponds to the second opening 8, and the second opening 8 is formed after removing a part of the second region of the second electrode. Specifically, the second metal mask 6 is placed over the protection material layer 5, and the first opening 7 is formed on the protection material layer 5 and the second opening 8 is formed on the second electrode 4 by using the plasma treatment under a protection of the second metal mask 6. For example, the second metal mask 6 is closely attached to the protection material layer 5. The protection layer 50 having the first opening protects the second electrode 4 during the plasma treatment from being damaged, and the protection layer 50 functions as a mask for the second electrode 4. As shown in FIG. 3f, a third opening 61 is formed in the second metal mask 6, the third opening 61 corresponds to the first opening 7 and the second opening 8, and the third opening 61 is used for forming the first opening 7 and the second opening 8. Optionally, the second metal mask 6 is a Chemical Vapor Deposition mask to be compatible with conventional processes. In practical applications, optionally, the first region of the protection material layer 5 and the second region of the second electrode 4 may be subjected to a chemical etching treatment (for example, a chemical etching treatment using a gas) through the second metal mask 6, so as to form the first opening 7 in the protection material layer 5 and form the second opening 8 in the second electrode 4.

In this step, plasma entering from the third opening 61 of the second metal mask 6 is mainly confined to the first opening 7 by the third opening 61, and rarely spreads to a peripheral region of the first opening 7. Due to a protection of the protection layer 50 having the first opening 7, when a portion under the first opening 7 of the second electrode 4 is processed by the plasma, only the portion under the first opening 7 of the second electrode 4 is processed by the plasma, thereby achieving purpose of removing only the portion under the first opening 7 of the second electrode 4 without damaging other portions. The method of the present embodiment may remove only the portion of the second electrode 4 that needs to be removed, thereby avoiding a failure of light-emitting devices caused by damaging other portions of the second electrode, and improving a local light transmittance of the light-emitting devices and an overall yield of product.

In this embodiment, a position of the first opening 7 may correspond to a camera region of a display device, and therefore a position of the second opening 8 of the second electrode 4 also corresponds to the camera region, and therefore a light transmittance of the camera region may be improved.

Step 206, forming a first encapsulation layer on a side of the protection layer having the first opening distal to the base substrate.

Figure 3G:
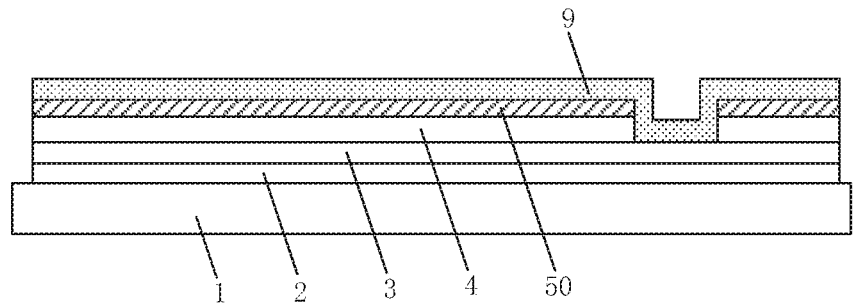
FIG. 3g is a schematic view illustrating forming a first encapsulation layer.

FIG. 3g is a schematic view illustrating forming a first encapsulation layer. As shown in FIG. 3g, a first encapsulation layer 9 is formed on a side of the protection layer 50 distal to the base substrate 1, and the first encapsulation layer 9 fills in the first opening 7 and the second opening 8. Optionally, a material of the first encapsulation layer 9 is an inorganic material, and a thickness of the first encapsulation layer 9 is in a range of 50 nm to 800 nm. In this step, the first encapsulation layer 9 may be formed by using a same process as the process of forming the protection material layer 5 in step 204, and a description thereof will not be repeated. In this embodiment, a thickness of the first encapsulation layer 9 is greater than that of the protection material layer 5.

Step 207, forming a second encapsulation layer on a side of the first encapsulation layer distal to the base substrate.

Figure 3H:
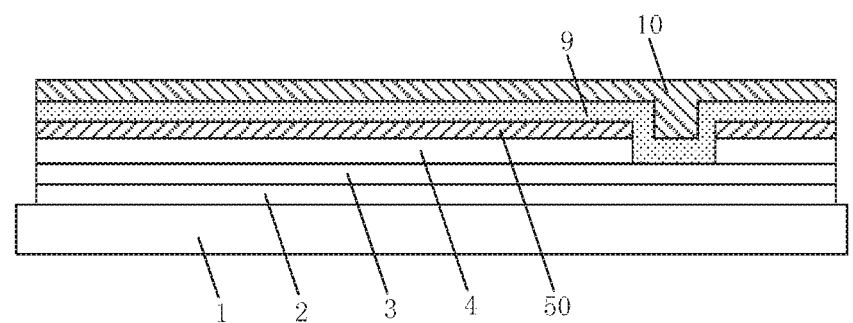
FIG. 3h is a schematic view illustrating forming a second encapsulation layer.

FIG. 3h is a schematic view illustrating forming a second encapsulation layer. As shown in FIG. 3h, a second encapsulation layer 10 is formed on a side of the first encapsulation layer 9 distal to the base substrate 1. Specifically, the second encapsulation layer 10 may be formed on a side of the first encapsulation layer 9 distal to the base substrate 1 by an Ink Jet Printer (IJP) process. Optionally, a material of the second encapsulation layer 10 is an organic material.

Step 208, forming a third encapsulation layer on a side of the second encapsulation layer distal to the base substrate.

Figure 3I:
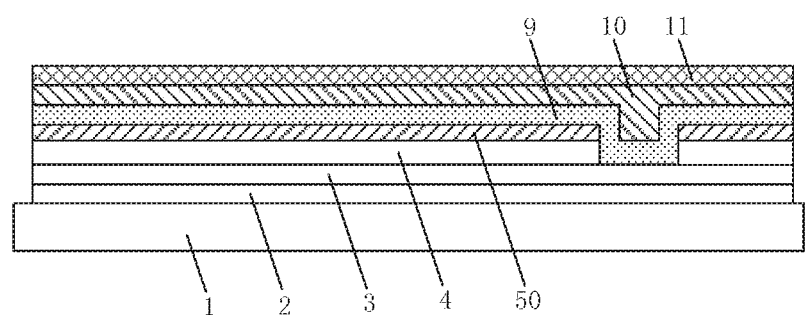
FIG. 3i is a schematic view illustrating forming a third encapsulation layer.

FIG. 3i is a schematic view illustrating forming a third encapsulation layer. As shown in FIG. 3i, a third encapsulation layer 11 is formed on a side of the second encapsulation layer 10 distal to the base substrate 1. Optionally, a material of the third encapsulation layer 11 is an inorganic material. In this step, the third encapsulation layer 11 may be formed by using a same process as the process of forming the protection material layer 5 in step 204, and a description thereof will not be repeated. To this end, after the protection material layer 5 through the third encapsulation layer 11 are formed, the TFE process is completed.

In the technical solution of the method for manufacturing a display substrate provided in this embodiment, a protection material layer is formed on a side of the second electrode distal to the base substrate, a first opening is formed in the protection material layer to form a protection layer, and a second opening is formed in the second electrode, where the second opening is located below the first opening. In this embodiment, under a protection of the protection layer having the first opening, only a portion of the second electrode below the first opening is removed, so that the peripheral portion of the second opening in the second electrode below the first opening is prevented from being damaged, and when the first opening corresponds to a camera region, the portion of the second electrode at the periphery of the camera region is prevented from being damaged, thereby reducing a poor display of a display device.

Figure 4:
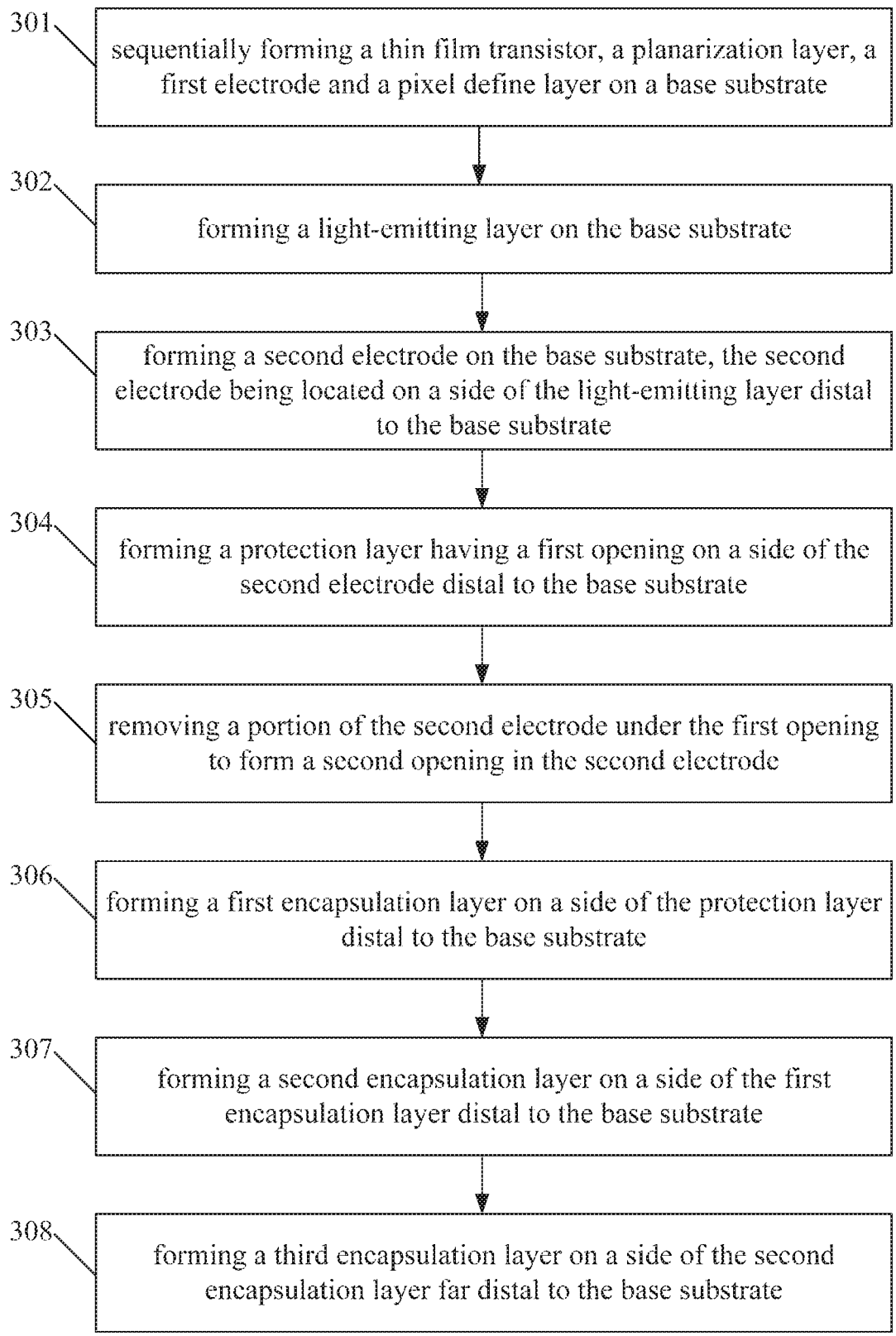
FIG. 4 is a flowchart of a method for manufacturing a display substrate according to an embodiment of the present disclosure.

FIG. 4 is a flowchart of a method for manufacturing a display substrate according to an embodiment of the present disclosure, and as shown in FIG. 4, the method includes:

Step 301, sequentially forming a thin film transistor, a planarization layer, a first electrode and a pixel define layer on the base substrate, as shown in FIG. 2b. Further, a photo spacer may also be formed on the pixel define layer.

The detailed description of step 301 may refer to step 201 in the embodiment shown in FIG. 2, and the description is not repeated here.

Step 302, forming a light-emitting layer on the base substrate.

The detailed description of step 302 may refer to step 202 in the embodiment shown in FIG. 2, and the description is not repeated here.

Step 303, forming a second electrode on the base substrate, wherein the second electrode is located on a side of the light-emitting layer distal to the base substrate.

The detailed description of step 303 may refer to step 203 in the embodiment shown in FIG. 2, and the description is not repeated here.

Step 304, forming a protection layer having a first opening on a side of the second electrode distal to the base substrate.

Figure 5A:
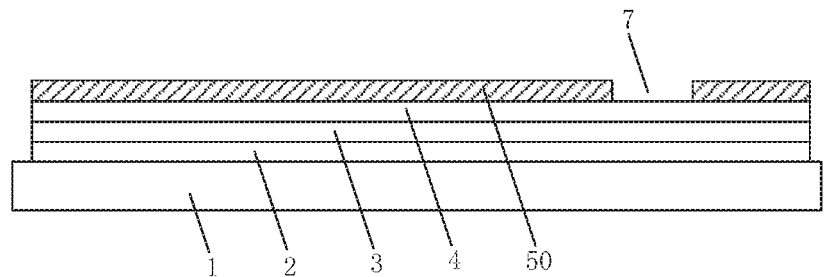
FIG. 5a is a schematic view illustrating forming a protection layer having a first opening.

FIG. 5a is a schematic view illustrating forming a protection layer having a first opening. As shown in FIG. 5a, a protection layer 50 having a first opening 7 is formed on a side of the second electrode 4 distal to the base substrate 1 through a third metal mask. Specifically, the protection layer 50 having the first opening 7 is formed through a third metal mask and by using a Chemical Vapor Deposition (CVD) process. Optionally, a material of the protection layer 50 is an inorganic material, and a thickness of the protection layer 50 is in a range of 10 nm to 600 nm. Optionally, the third metal mask is a Chemical Vapor Deposition mask.

In the present embodiment, a thickness of the second electrode 4 is in a range of 1 nm to 25 nm. A thickness of the second electrode (cathode) 4 is very thin, so that the second electrode cannot be in direct contact with the third metal mask in process, so as to avoid contamination or breakage of the second electrode.

Figure 5B:
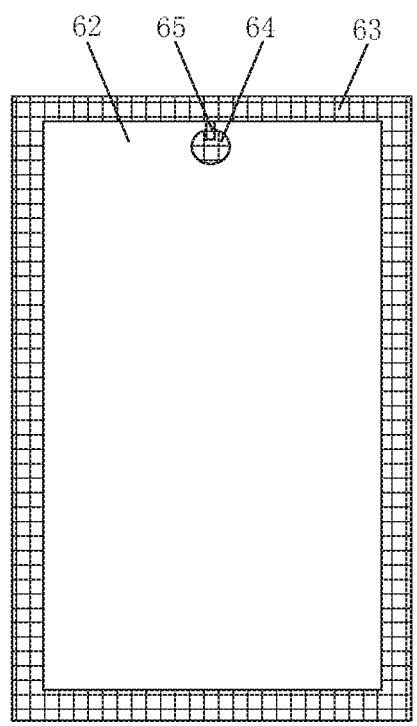
FIG. 5b is a schematic view illustrating a third metal mask.

FIG. 5b is a schematic view illustrating a third metal mask. As shown in FIG. 5b, the third metal mask is divided into a display region 62 and a non-display region 63, the non-display region 63 is located at periphery of the display region 62, and the display region 62 is used to form the protection layer 50. The third metal mask includes a blocking structure 64 and a connection structure 65. The blocking structure 64 is located in the display region 62 near the non-display region 63, the blocking structure 64 is connected to a mask material in the non-display region 63 through the connection structure 65, and a region of the display region 62 except the blocking structure 64 and the connection structure 65 is a hollow region. The blocking structure 64 corresponds to the first opening 7, the blocking structure 64 is used to form the first opening 7, and an inorganic material at a position of the first opening 7 is thinner or no inorganic material is formed at the position. That is, the protection layer 50 having the first opening 7 is formed by one single process by using the third metal mask in this step. Since the region of the display region 62 except the blocking structure 64 and the connection structure 65 is a hollow region, and the blocking structure 64 is located in the display region 62, the connection structure 65 is provided to fix the blocking structure 64 on a mask material of the non-display region 63. In actual manufacturing process, the connection structure 65 is sized so that the connection structure 65 does not affect shape and size of the first opening 7 to be formed.

Figure 5C:
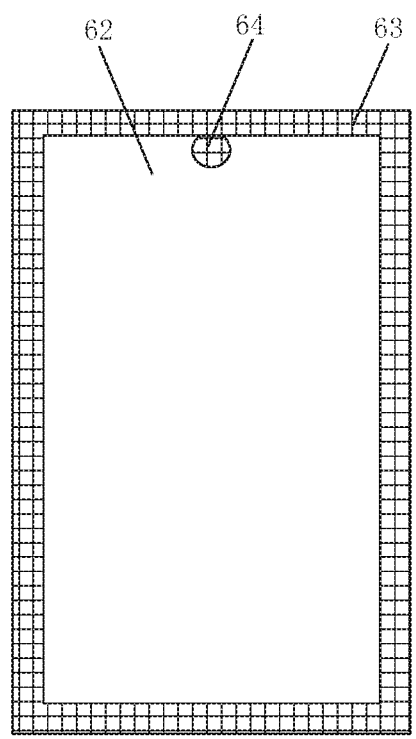
FIG. 5c is a schematic view illustrating a third metal mask.

FIG. 5c is a schematic view illustrating a third metal mask. As shown in FIG. 5c, the third metal mask is divided into a display region 62 and a non-display region 63, and the non-display region 63 is located at periphery of the display region 62. The third metal mask includes a blocking structure 64. The display region 62 is used to form the protection layer 50. The blocking structure 64 is directly connected to a mask material of the non-display region 63, and a region of the display region 62 except the blocking structure 64 is a hollow region. The blocking structure 64 corresponds to the first opening 7, the blocking structure 64 is used to form the first opening 7, and an inorganic material at a position of the first opening 7 is thinner or no inorganic material is formed at the position. That is, the protection layer 50 having the first opening 7 is formed by one single process by using the third metal mask in this step.

In this embodiment, the blocking structure 64 in FIG. 5b and FIG. 5c is provided corresponding to a camera region of a display device, so a position of the blocking structure 64 on the third metal mask needs to be set according to a position of the camera region of the display device, for example, FIG. 5b and FIG. 5c show the third metal mask corresponding to the camera region in two different positions.

In this embodiment, the first opening 7 may be provided corresponding to the camera region of the display device, so that the second opening of the second electrode 4 corresponds to a second region of the second electrode 4 corresponding to the camera region, and after a portion of the second region of the second electrode is removed to form the second opening, a light transmittance of the camera region is improved.

Step 305, removing a portion of the second electrode under the first opening to form a second opening in the second electrode.

Figure 5D:
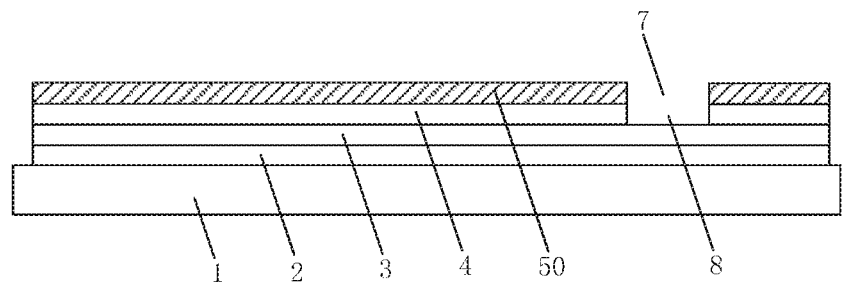
FIG. 5d is a schematic view illustrating forming a second opening in the second electrode.

FIG. 5d is a schematic view illustrating forming a second opening. As shown in FIG. 5d, a portion of the second electrode 4 under the first opening 7 is subjected to a plasma bombardment or chemical etching to remove the portion of the second electrode under the first opening 7 to form a second opening 8 in the second electrode 4. Specifically, the portion of the second electrode 4 under the first opening 7 is subjected to the plasma bombardment or chemical etching treatment through the second metal mask to remove the portion of the second electrode 4 under the first opening 7; alternatively, instead of using any mask, the portion of the second electrode 4 under the first opening 7 may be directly subjected to the plasma bombardment or chemical etching treatment to remove the portion of the second electrode 4 under the first opening 7, and the protection layer 50 having the first opening 7 may serve as a mask.

Step 306, forming a first encapsulation layer on a side of the protection layer distal to the base substrate.

The detailed description of step 306 may refer to step 206 in the embodiment shown in FIG. 2, and the description is not repeated here.

Step 307, forming a second encapsulation layer on a side of the first encapsulation layer distal to the base substrate.

The detailed description of step 307 may refer to step 207 in the embodiment shown in FIG. 2, and the description is not repeated here.

Step 308, forming a third encapsulation layer on a side of the second encapsulation layer far distal to the base substrate.

The detailed description of step 308 may refer to step 208 in the embodiment shown in FIG. 2, and the description is not repeated here.

In the technical solution of the method for manufacturing a display substrate provided in this embodiment, a protection layer having a first opening is formed on a side of the second electrode distal to the base substrate, and a second opening is formed in the second electrode, the second opening is located below the first opening. In this embodiment, under a protection of the protection layer, only a portion of the second electrode below the first opening is removed, so that a peripheral portion of the second opening in the second electrode below the first opening is prevented from being damaged. When the first opening corresponds to the camera region, a portion of the second electrode at the periphery of the camera region is prevented from being damaged, thereby eliminating a poor display of a display device.

The embodiment of the present disclosure also provides an organic light-emitting diode display substrate. As shown in FIG. 3e and FIG. 3i, the display substrate includes: a base substrate 1, and a first electrode 2, a light-emitting layer 3 and a second electrode 4 having a second opening which are sequentially provided on the base substrate 1, a protection layer 50 having a first opening is provided on a side of the second electrode 4 distal to the base substrate 1, the second opening 8 is located below the first opening 7, and orthographic projections of the second opening and the first opening on the base substrate are substantially overlapped with each other.

Further, the display substrate further includes a first encapsulation layer 9, the first encapsulation layer 9 is located on a side of the protection layer 50 distal to the base substrate 1, and the first encapsulation layer 9 fills in the first opening 7 and the second opening 8.

Further, the display substrate further includes a second encapsulation layer 10, and the second encapsulation layer 10 is located on a side of the first encapsulation layer 9 distal to the base substrate 1.

Further, the display substrate further includes a third encapsulation layer 11, and the third encapsulation layer 11 is located on a side of the second encapsulation layer 10 distal to the base substrate 1.

In this embodiment, optionally, the display substrate is a flexible display substrate.

The display substrate in this embodiment may be manufactured by the method of manufacturing the display substrate provided in the above embodiment, and for a specific description of each structure in the display substrate, reference may be made to the description of the above embodiment, and details are not repeated herein.

In the technical solution of the display substrate provided in this embodiment, a protection layer having a first opening is provided on a side of the second electrode having a second opening distal to the base substrate, and the second opening is provided below the first opening, and orthographic projections of the second opening and the first opening on the base substrate are substantially overlapped with each other. In this embodiment, openings in the second electrode and the protection layer are substantially in a same shape, and when the first opening and the second opening correspond to a camera region, a portion of the second electrode at the periphery of the camera region is prevented from being damaged, thereby improving an aperture ratio and a utilization rate of a display device.

Figure 6:
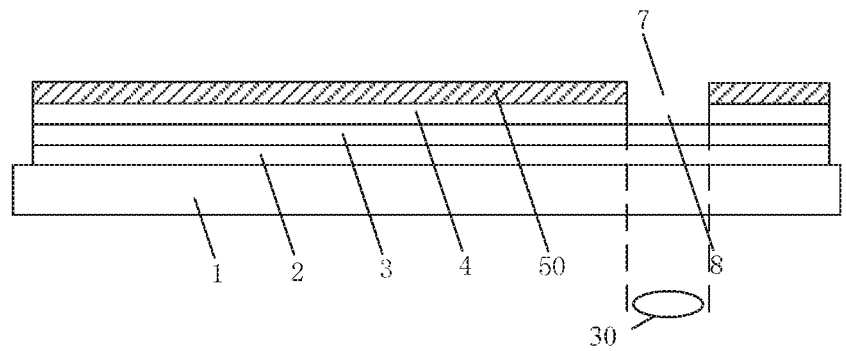
FIG. 6 shows a schematic view illustrating a display device including a camera.

The embodiment of the present disclosure also provides a display device, which includes a display substrate, and the display substrate may include the above organic light-emitting diode display substrate. The display device further includes a camera 30 provided corresponding to the second opening of the second electrode, as shown in FIG. 6.

Further, the display device further includes a protection structure, and the protection structure and the display substrate are oppositely arranged. The protection structure may include a cover plate or a protection film layer.

In this embodiment, the display device may be an OLED display device. Optionally, the display device is a flexible display device.

In the technical solution of the display device provided in this embodiment, a protection layer having a first opening is formed on a side of the second electrode distal to the base substrate, and the second electrode has a second opening located below the first opening, and orthographic projections of the second opening and the first opening on the base substrate are substantially overlapped with each other. In this embodiment, with the protection layer, only a portion of the second electrode below the first opening is removed, so that a peripheral portion of the second opening in the second electrode below the first opening is prevented from being damaged. When the first opening corresponds to a camera region, the portion of the second electrode at the periphery of the camera region is prevented from being damaged, thereby eliminating a poor display of the display device.

It will be understood that, the above embodiments are merely exemplary embodiments employed to illustrate the principles of the present disclosure, but the present disclosure is not limited thereto. It will be apparent to those skilled in the art that various changes and modifications may be made therein without departing from the spirit and scope of the present disclosure, and these changes and modifications are to be considered within the scope of the present disclosure.

What is claimed is:

1. A method for manufacturing an organic light-emitting diode display substrate, comprising:
   sequentially forming a first electrode, a light-emitting layer and a second electrode on a base substrate;
   forming a protection layer having a first opening on a side of the second electrode distal to the base substrate; and
   forming a second opening in the second electrode, the second opening being located below the first opening,
   wherein the forming a protection layer having a first opening on a side of the second electrode distal to the base substrate; and the forming a second opening in the second electrode, the second opening being located below the first opening comprise:
   forming a protection material layer on a side of the second electrode distal to the base substrate by a first metal mask; and
   forming the first opening in the protection material layer to form the protection layer having the first opening; and forming the second opening in the second electrode.

2. The method for manufacturing an organic light-emitting diode display substrate of claim 1, wherein the second electrode is a cathode.

3. The method for manufacturing an organic light-emitting diode display substrate of claim 1, wherein the forming the first opening in the protection material layer to form the protection layer having the first opening; and forming the second opening in the second electrode comprises:
   forming the first opening in the protection material layer and forming the second opening in the second electrode by causing a first region of the protection material layer corresponding to the first opening to be formed and a second region of the second electrode corresponding to the first region to be subjected to a plasma treatment or a chemical etching treatment through a second metal mask.

4. The method for manufacturing an organic light-emitting diode display substrate of claim 1, wherein a material of the protection layer is an inorganic material.

5. The method for manufacturing an organic light-emitting diode display substrate of claim 1, wherein the protection layer has a thickness in a range of about 10 nm to about 600 nm.

6. The method for manufacturing an organic light-emitting diode display substrate of claim 1, further comprising:
   forming a first encapsulation layer on a side of the protection layer distal to the base substrate, wherein the first encapsulation layer fills in the first opening and the second opening.

7. The method for manufacturing an organic light-emitting diode display substrate of claim 6, wherein a material of the first encapsulation layer is an inorganic material.

8. The method for manufacturing an organic light-emitting diode display substrate of claim 6, wherein the first encapsulation layer has a thickness in a range of about 50 nm to about 800 nm.

9. A method for manufacturing an organic light-emitting diode display substrate, comprising:
   sequentially forming a first electrode, a light-emitting layer and a second electrode on a base substrate;
   forming a protection layer having a first opening on a side of the second electrode distal to the base substrate; and
   forming a second opening in the second electrode, the second opening being located below the first opening,
   wherein the forming a protection layer having a first opening on a side of the second electrode distal to the base substrate; and forming a second opening in the second electrode, the second opening being located below the first opening comprise:
   forming the protection layer having the first opening on a side of the second electrode distal to the base substrate by attaching a third metal mask to the second electrode; and
   removing a portion of the second electrode below the first opening to form the second opening in the second electrode.

10. The method for manufacturing an organic light-emitting diode display substrate of claim 9, wherein the forming the protection layer having the first opening on a side of the second electrode distal to the base substrate by attaching a third metal mask to the second electrode comprises:
    forming the protection layer having the first opening on a side of the second electrode distal to the base substrate through a third metal mask and by using a chemical vapor deposition process, wherein a blocking structure for forming the first opening is formed on the third metal mask.

11. The method for manufacturing an organic light-emitting diode display substrate of claim 9, wherein the removing a portion of the second electrode below the first opening to form the second opening in the second electrode comprises:
    forming the second opening in the second electrode by causing the portion of the second electrode below the first opening to be subjected to a plasma bombardment or a chemical etching treatment through a second metal mask to remove the portion of the second electrode below the first opening, wherein a third opening for forming the second opening is formed on the second metal mask.

12. The method for manufacturing an organic light-emitting diode display substrate of claim 9, wherein the removing a portion of the second electrode below the first opening to form the second opening in the second electrode comprises:
    forming the second opening in the second electrode by using the protection layer having the first opening as a mask to cause the portion of the second electrode below the first opening to be subjected to a plasma bombardment or a chemical etching treatment to remove the portion of the second electrode below the first opening.

13. The method for manufacturing an organic light-emitting diode display substrate of claim 9, wherein the second electrode is a cathode.

14. The method for manufacturing an organic light-emitting diode display substrate of claim 9, wherein a material of the protection layer is an inorganic material.

15. An organic light-emitting diode display substrate, comprising:
    a base substrate;
    a first electrode, a light-emitting layer and a second electrode having a second opening sequentially provided on the base substrate; and
    a protection layer having a first opening on a side of the second electrode distal to the base substrate,
    wherein the second opening is below the first opening, and orthographic projections of the first opening and the second opening on the base substrate are substantially overlapped with each other,
    the organic light-emitting diode display substrate further comprises a first encapsulation layer on a side of the protection layer distal to the base substrate, the first encapsulation layer fills in the first opening and the second opening.

16. The organic light-emitting diode display substrate of claim 15, wherein a material of the protection layer is an inorganic material.

17. The organic light-emitting diode display substrate of claim 16, wherein the protection layer has a thickness in a range of about 10 nm to about 600 nm.

18. The organic light-emitting diode display substrate of claim 17, wherein the first encapsulation layer has a thickness in a range of about 50 nm to about 800 nm, and/or a material of the first encapsulation layer is an inorganic material.

19. A display device, comprising the organic light-emitting diode display substrate of claim 15 and a camera, wherein
    the camera is on a side of the base substrate distal to the second electrode, and
    an orthographic projection of the camera on the base substrate is within the orthographic projection of the second opening on the base substrate, or the orthographic projection of the camera on the base substrate is substantially overlapped with the orthographic projection of the second opening on the base substrate.

20. The display device of claim 19, further comprising a first encapsulation layer on a side of the protection layer distal to the base substrate, wherein the first encapsulation layer fills in the first opening and the second opening.

* * * * *